(12) United States Patent
Strach et al.

(10) Patent No.: US 11,586,267 B2
(45) Date of Patent: Feb. 21, 2023

(54) FINE RESOLUTION ON-CHIP VOLTAGE SIMULATION TO PREVENT UNDER VOLTAGE CONDITIONS

(71) Applicant: International Business Machines Corporation, Armonk, NY (US)

(72) Inventors: Thomas Strach, Wildberg (DE); Preetham M. Lobo, Bangalore (IN); Tobias Webel, Schwaebisch-Gmuend (DE)

(73) Assignee: International Business Machines Corporation, Armonk, NY (US)

( * ) Notice: Subject to any disclaimer, the term of this patent is extended or adjusted under 35 U.S.C. 154(b) by 1099 days.

(21) Appl. No.: 16/225,301

(22) Filed: Dec. 19, 2018

(65) Prior Publication Data

US 2020/0201413 A1  Jun. 25, 2020

(51) Int. Cl.
  *G06F 1/3206*  (2019.01)
  *G06F 1/3287*  (2019.01)
  *H02H 1/06*  (2006.01)
  *H02H 3/247*  (2006.01)
  *G01R 19/165*  (2006.01)

(52) U.S. Cl.
  CPC ......... *G06F 1/3206* (2013.01); *G01R 19/165* (2013.01); *G06F 1/3287* (2013.01); *H02H 1/06* (2013.01); *H02H 3/247* (2013.01)

(58) Field of Classification Search
  CPC ........ G06F 1/3206; G06F 1/3287; G06F 1/30; G06F 1/28; G01R 19/165; H02H 1/06; H02H 3/247
  See application file for complete search history.

(56) References Cited

U.S. PATENT DOCUMENTS

| 7,937,563 | B2 * | 5/2011 | Naffziger | G06F 9/3869 |
| | | | | 712/214 |
| 8,816,757 | B1 | 8/2014 | Yabbo et al. | |
| 8,943,334 | B2 | 1/2015 | Kumar et al. | |
| 9,292,295 | B2 | 3/2016 | Shirvani et al. | |
| 9,811,150 | B2 | 11/2017 | Allen-Ware et al. | |

(Continued)

FOREIGN PATENT DOCUMENTS

| EP | 2596413 B1 | 12/2016 |
| GB | 201616341 | 11/2016 |

OTHER PUBLICATIONS

Floyd et al., "Voltage Droop Reduction Using Throttling Controlled by Timing Margin Feedback", 2012 Symposium on VLSI Circuits (VLSIC), Jun. 13-15, 2012, 2 pages.

(Continued)

*Primary Examiner* — Lee E Rodak
*Assistant Examiner* — Joseph O Nyamogo
(74) *Attorney, Agent, or Firm* — James L. Olsen

(57) ABSTRACT

Embodiments of the present disclosure relate to managing power provided to a semiconductor circuit to prevent undervoltage conditions. A measured voltage value describing a measured supply voltage at a first subcircuit of a semiconductor circuit can be received, the measured voltage value having a first resolution. A selected metric indicative of a supply voltage present at the first subcircuit can be received, the selected metric having a second resolution higher than the first resolution. The selected metric is calibrated to obtain a calibrated metric when a transition of the measured voltage value occurs.

18 Claims, 5 Drawing Sheets

(56) References Cited

U.S. PATENT DOCUMENTS

| | | | |
|---|---|---|---|
| 2009/0150695 A1 | 6/2009 | Song et al. | |
| 2011/0074398 A1* | 3/2011 | Barton | G01R 19/0084 |
| | | | 324/133 |
| 2014/0181537 A1* | 6/2014 | Manne | G06F 1/324 |
| | | | 713/300 |
| 2016/0098070 A1 | 4/2016 | Curran et al. | |
| 2017/0153916 A1 | 6/2017 | Xu et al. | |
| 2018/0088650 A1* | 3/2018 | Lobo | G06F 1/266 |

OTHER PUBLICATIONS

Dasgupta et al., "Real-Time Monitoring of Short-Term Voltage Stability Using PMU Data", 2014 IEEE PES General Meeting | Conference & Exposition, Jul. 27-31, 2014, Summary Only, 1 page.
Strach et al., "Predictive On-Chip Voltage Simulation to Detect Near-Future Under Voltage Conditions", U.S. Appl. No. 16/225,333, filed Dec. 19, 2018.
IBM, List of IBM Patents or Patent Applications Treated as Related, Dec. 19, 2018, 2 pages.

* cited by examiner

FINE RESOLUTION ON-CHIP VOLTAGE SIMULATION TO PREVENT UNDER VOLTAGE CONDITIONS

BACKGROUND

The present disclosure relates generally to semiconductor circuits, and in particular to preventing undervoltage conditions in semiconductor circuits.

In a processor there is circuit switching activity at each clock cycle which results in noise on the common supply rail (e.g., power grid noise). A sudden local increase in switching activity can induce a local droop in the supply voltage to the common supply rail of the power distribution network. This local droop then propagates over the chip area and affects the supply voltage in other regions.

Semiconductor circuit voltage is a rapidly varying quantity within processors. For example, the voltage provided to a chip can change by 100 mV within a few nanoseconds when a processor changes its activity. With tight voltage margins on present semiconductor designs, it is increasingly important to detect undervoltage conditions as fast as possible. This is typically completed by using on-chip measurement circuitry such as Chip Power Model (CPM) or simulation engines such as distributed delayed instruction per cycle (dIPC).

An issue with CPM is the limited voltage resolution (e.g., ~20 mV) per CPM sample. This can prevent detecting small voltage changes. Distributed dIPC may not be able to accurately determine an absolute voltage level on the chip, though it is fast and accurate in determining voltage fluctuations (e.g., with voltage resolution of approximately ~1 mV). Accordingly, though CPM can accurately determine the absolute voltage level on the chip, CPM may not be able to detect small voltage fluctuations, and though distributed dIPC can detect small voltage fluctuations, distributed dIPC may not be able to accurately determine a voltage level on the chip.

SUMMARY

Aspects of the present disclosure include a semiconductor circuit configured to prevent undervoltage conditions. The semiconductor circuit can include a first subcircuit including a measurement input configured to receive a measured voltage value describing the measured supply voltage at the first subcircuit, wherein the measured voltage value has a first resolution. The semiconductor can include a simulator input configured to receive a selected metric indicative of a supply voltage present at the first subcircuit, wherein the selected metric has a second resolution, wherein the second resolution is higher than the first resolution. The semiconductor can further include a calibration circuit configured to calibrate the selected metric to obtain a calibrated metric when a transition of the measured voltage value occurs.

Thus, various embodiments of the present disclosure advantageously enable the calibration of a supply voltage present at a first subcircuit of a semiconductor circuit by sampling voltage at the first subcircuit via two measurements with distinct resolutions. The first measurement may be accurate but low resolution. The second measurement may be inaccurate but high resolution. The calibrated metric can be used to more rapidly and accurately detect undervoltage conditions present at the semiconductor circuit.

In some optional embodiments, the semiconductor circuit can include a throttle signal generator. The throttle signal generator can be configured to generate a subcircuit throttle signal to throttle the first subcircuit based on the calibrated metric.

Thus, subcircuits present on the semiconductor circuit can be throttled based on the calibrated metric. As mentioned above, the calibrated metric can be used to more rapidly and accurately detect undervoltage conditions. Accordingly, throttling a subcircuit based on the calibrated metric allows for faster throttling compared to traditional techniques.

Embodiments of the present disclosure further include a method for preventing undervoltage conditions. A measured voltage value describing a measured supply voltage at a first subcircuit of a semiconductor circuit can be received, the measured voltage value having a first resolution. A selected metric indicative of a supply voltage present at the first subcircuit can be received, the selected metric having a second resolution higher than the first resolution. The selected metric is calibrated to obtain a calibrated metric when a transition of the measured voltage value occurs.

Thus, various embodiments of the present disclosure advantageously enable the calibration of a supply voltage present at a first subcircuit of a semiconductor circuit by sampling voltage at the subcircuit via two measurements with distinct resolutions. The first measurement may be accurate but low resolution. The second measurement may be inaccurate but high resolution. The calibrated metric can be used to more rapidly and accurately detect undervoltage conditions present at the semiconductor circuit.

In some optional embodiments, the method can further include throttling the first subcircuit based on the calibrated metric. Thus, subcircuits present on the semiconductor circuit can be throttled based on the calibrated metric. As mentioned above, the calibrated metric can be used to more rapidly and accurately detect undervoltage conditions. Accordingly, throttling a subcircuit based on the calibrated metric allows for faster throttling compared to traditional techniques.

The above summary is not intended to describe each illustrated embodiment or every implementation of the present disclosure. The aforementioned advantages represent example advantages, and therefore, not all advantages of the various embodiments are described herein. Furthermore, some embodiments of the present disclosure can exhibit none, some, or all of the advantages listed herein while remaining within the spirit and scope of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
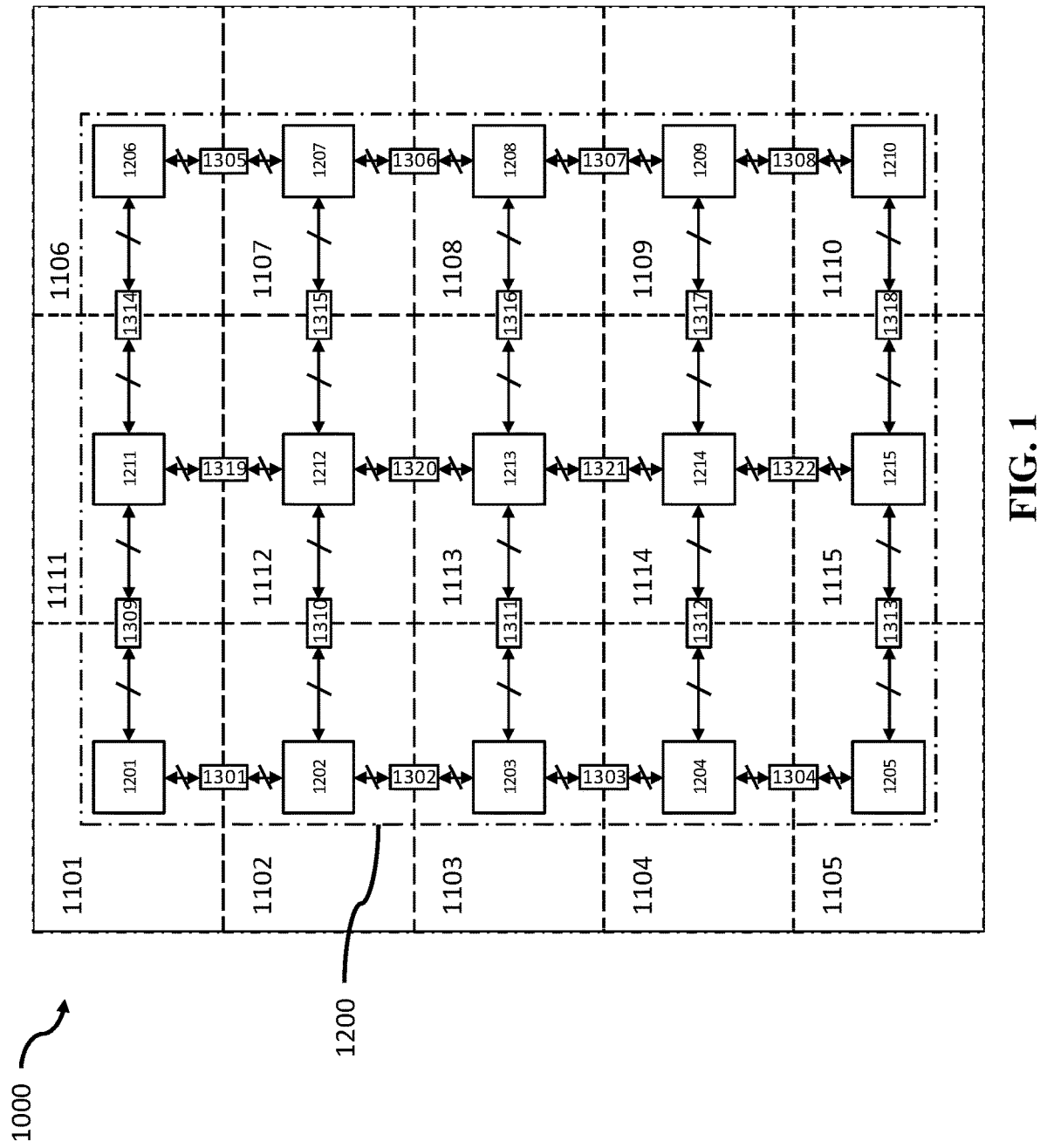
FIG. 1 is a diagram depicting a semiconductor circuit, in accordance with embodiments of the present disclosure

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relate generally to semiconductor circuits, and in particular to preventing undervoltage conditions in semiconductor circuits. While the present disclosure is not necessarily limited to such applications, various aspects of the disclosure can be appreciated through a discussion of various examples using this context.

In a processor circuit switching activity occurs at each clock cycle which results in noise on the common supply rail (e.g., power grid noise). A sudden local increase in switching activity can induce a local droop in the supply voltage to the common supply rail of the power distribution network. This local droop then propagates over the chip area and affects the supply voltage in other regions. However, supply voltage may only fluctuate within a certain margin to ensure proper functioning of the semiconductor circuit.

Semiconductor circuit voltage is a rapidly varying quantity within processors. For example, the voltage provided to a chip can change by 100 mV within a few nanoseconds when a processor changes its activity. With tight voltage margins on present semiconductor designs, it is increasingly important to detect undervoltage conditions as fast as possible. This is typically completed by using on-chip measurement circuitry such as Chip Power Model (CPM) or simulation engines such as distributed delayed instruction per cycle (dIPC).

An issue with CPM is the limited voltage resolution (e.g., ~20 mV) per CPM sample. This can prevent detecting small voltage changes. Distributed dIPC may not be able to accurately determine an absolute voltage level on the chip, though it is fast and accurate in determining voltage fluctuations (e.g., with voltage resolution of approximately ~1 mV). Accordingly, though CPM can accurately determine the absolute voltage level on the chip, CPM may not be able to detect small voltage fluctuations, and though distributed dIPC can detect small voltage fluctuations, dIPC may not be able to accurately determine a voltage level on the chip.

Aspects of the present disclosure leverage the advantages of both CPM and distributed dIPC to allow detection of potential undervoltage conditions faster and with higher accuracy. In particular, detecting a low voltage condition with CPM and thereafter tracking the voltage with distributed dIPC increases the resolution of the voltage measurement and allows for faster throttling than either CPM or distributed dIPC can individually achieve.

FIG. 1 is a circuit diagram illustrating a semiconductor circuit 1000 including a plurality of subcircuits 1101-1115. In embodiments, the semiconductor circuit 1000 is a computer processor chip. In embodiments, subcircuits 1101-1110 correspond to the processor cores of the computer processor chip. In embodiments, subcircuits 1111-1115 correspond to the cache of the computer processor chip, allowing for data transfer between the different processor cores (e.g., subcircuits 1101-1110).

The subcircuits 1101-1115 can be provided power by a common power supply, for example, a power grid placed above the subcircuits. During operation, the power consumption of the subcircuits 1101 to 1115 can fluctuate. For example, subcircuit 1105 can comprise a pipeline of a processing unit, where at least a portion of the pipeline includes an arithmetic unit, a load/store unit, a cache access unit, an instruction sequencing unit and an instruction decode unit. At a certain point of time, the pipeline can perform various switching operations. During these switching operations, the current supplied to subcircuit 1105 by the power supply can be high. At the same time, subcircuits 1104 and 1115 can be in an idle state and experience low power supply current. This can cause a cross current from subcircuits 1104 and 1115 to the subcircuit 1105. A high power supply current of subcircuit 1103, which is not entirely compensated by cross currents from the neighboring subcircuits 1102 and 1104, can cause a local voltage droop at the subcircuit 1105 of the supply voltage. Furthermore, the cross current from the subcircuits 1102 and 1104 can induce voltage droops at the subcircuits 1102 and 1104, even if the subcircuit 1102 and 1104 are in an idle state.

In embodiments of the present disclosure, the semiconductor circuit 1000 includes a power management circuitry 1200. The power management circuitry 1200 is configured to estimate a metric indicative of a momentary supply voltage present at the first subcircuit 1105 based on a power supply current of the subcircuit 1105 and a cross current flowing between the subcircuit 1105 and the subcircuits 1104 and 1115. The power management circuitry 1200 can derive the momentary supply voltage without actually measuring the power supply current of the subcircuit 1105, but based on activity indicators related to at least one part of the pipeline. Moreover, the power management circuitry 1200 can estimate the cross current based on current increments calculated from the momentary supply voltage.

As depicted in FIG. 1, the power management circuitry 1200 includes a grid (e.g., a network) of power management units 1201-1215. Each power management unit 1201-1215 corresponds to a respective subcircuit 1101-1115 (e.g., power management unit 1201 corresponds to subcircuit 1101, power management unit 1202 corresponds to subcircuit 1102, etc.). The power management units 1201-1215 can be configured to estimate the momentary supply voltage related to subcircuits 1101-1115. Further, the power management units 1201-1215 can be configured to throttle the subcircuit 1101 to 1115 based on the momentary supply voltage. For example, if the momentary supply voltage is indicative of a low local supply voltage at the subcircuit 1105, the operation frequency of the subcircuit 1105 can be lowered to ensure proper functioning of the semiconductor circuit.

The power management units 1201-1215 are connected to one another with connecting units 1301-1322. The connecting units 1301-1322 can enable data exchange between the power management units 1201-1215 relating to the cross current between the associated subcircuits. In some embodiments, the bit width of the data connection between the power management units 1201-1215 and the connecting units 1301-1322 is twenty bits. The twenty bits can include one parity bit, one sign bit, and eight value bits for each direction.

It is noted that FIG. 1 is intended to depict the representative major components of an exemplary semiconductor circuit 1000. In some embodiments, however, individual components can have greater or lesser complexity than as represented in FIG. 1, components other than or in addition to those shown in FIG. 1 can be present, and the number, type, and configuration of such components can vary.

Figure 2:
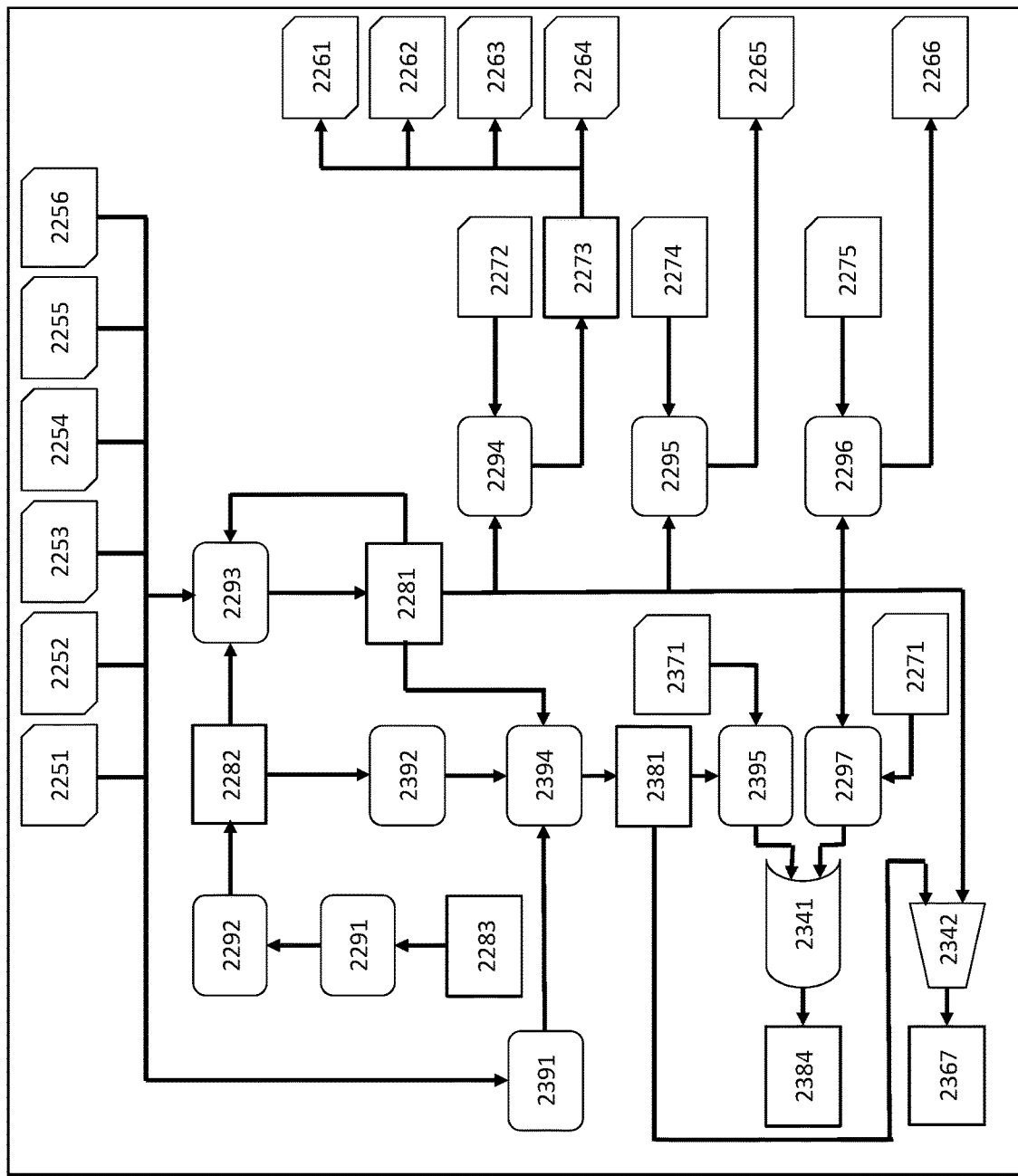
FIG. 2 is a diagram depicting a power management unit, in accordance with embodiments of the present disclosure.

Referring now to FIG. 2, shown is a diagram of a power management unit 2200 which can be implemented in a power management circuitry (e.g., power management circuitry 1200 of FIG. 1), in accordance with embodiments of the present disclosure. The power management unit 2200 includes four current signal inputs 2251, 2252, 2253 and 2254 configured to receive current signals indicative of a cross current from a subcircuit assigned to the power management unit 2200 to the immediately neighboring subcircuits. The power management unit 2200 further includes four increment current signal outputs 2261, 2262, 2263 and 2264 configured to transmit increment current signals indicative of a change of the cross current from the neighboring subcircuit to the subcircuit assigned to the power management unit 2200. The number of current signal inputs and increment current signal outputs can differ according to the number of neighboring subcircuits. For example, power management unit 1205 of FIG. 1 may only comprise two current signal inputs and two increment current signal outputs (based on two neighboring subcircuits 1104 and 1115).

Further, the power management unit 2200 includes a current signal input 2255 and a current signal input 2256 configured to receive a current signal indicative of a current from the subcircuit to ground and a signal indicative of a current to an external charge. Correspondingly, the power management unit 2200 also includes increment current outputs 2265 and 2266 for transmitting increment current signals indicative of a change of the current to ground and the current to the external charge, respectively.

In embodiments, the current signal inputs 2251-2256 can be configured to receive a 9 bit signal comprising one sign bit and 8 magnitude bits and the increment current signal outputs 2261-2266 can be configured to transmit a 9 bit signal comprising one sign bit, 6 magnitude bits and 2 fractional bits.

The power management unit 2200 further includes a momentary supply voltage register 2281 configured to store the momentary supply voltage present at an assigned subcircuit. The momentary supply voltage can also be considered as an indication of the charge accumulated by the assigned subcircuit (e.g., the addition of the previous self-current and cross current values in previous cycles). Moreover, the power management unit 2200 includes a self-current register 2282. The self-current register 2282 can be configured to store a value indicative of the power supply current of the assigned subcircuit. The value can, for example, be stored as an unsigned value with 7 magnitude bits.

In addition, the power management unit 2200 can include circuitry configured to determine the value indicative of the power supply current of the assigned subcircuit. In particular, this circuitry can include a core event register 2283, a weighting unit 2291, and a summing unit 2292. The weighting unit 2291 receives core events from the core event register 2283 and transmits weighted core events to the summing unit 2292. The summing unit 2292 transmits the sum of the weighted core events to the self-current register 2282.

As a simple example, one core event can be an arithmetic operation and another core event can be a cache access. Testing can show that the arithmetic operation involves a higher switching activity and a higher self-current than the cache access. Accordingly, a higher weight can be attributed to the core event "arithmetic operation" resulting in a higher number stored in the self-current register indicative of this higher self-current.

The power management unit 2200 further includes an adding unit 2293. The adding unit 2293 receives a self-current signal from the self-current register 2282, the current signal from the current signal inputs 2251-2256 and the momentary supply voltage from the momentary supply voltage register 2281. The received signals are added and transmitted to the momentary supply voltage register 2281. The momentary supply voltage register 2281 can be a register adapted for storing a number with one sign bit and 16 magnitude bits.

In the embodiment shown in FIG. 2, the power management unit 2200 comprises an increment current register 2273, an increment coefficient current register 2272, an increment coefficient current register 2274, and an increment coefficient current register 2275. The increment coefficient current registers 2272, 2274, and 2275 can be configured to store a coefficient indicative of the increment current induced by a certain value of the momentary supply voltage. The increment coefficient current registers 2272, 2274 and 2275 can be adapted to store a number including 12 fractional bits. The power management unit 2200 also includes multiplying units 2294, 2295 and 2296 receiving the momentary supply voltage from the momentary supply voltage register 2281 and increment coefficient currents from the increment current registers 2272, 2274 and 2275, respectively.

The multiplying units 2295 and 2296 can be configured to directly transmit the product thereof to the increment current signal outputs 2265 and 2266. The multiplying unit 2294 transmits the product to the increment current register 2273. The increment current register 2273 can be configured to store a number consisting of one sign bit, 6 magnitude bits and 2 fractional bits. The increment current signal outputs 2261-2264 can receive the increment current signal from the increment current register 2273.

The power management unit 2200 comprises a throttle threshold register 2271 and a comparing unit 2297. The comparing unit 2297 receives the momentary supply voltage from the momentary supply voltage register 2281 and a throttle threshold from the throttle threshold register 2271.

In addition, the power management unit 2200 includes a prediction unit 2392 configured to predict a self-current signal and a prediction unit 2391 configured to predict the current signal from current signal inputs 2251-2256, wherein the current signal can be indicative of a current to a neighboring subcircuit, indicative of a current from the subcircuit to ground, and/or indicative of a current to an external charge.

The prediction unit 2392 can predict a future self-current signal by analyzing the course (the previous self-current values over m of cycles) of the self-current signal. As a result of the prediction the prediction unit 2392 can output the maximum current signal during the last m number of cycles. For example, the prediction unit 2932 can output the maximum current signal during the last 8 number of cycles.

The prediction unit 2391 can predict a future cross current signal by analyzing the course (e.g., the previous cross current values over m cycles) of cross current values. For example, the prediction unit 2391 can output the maximum cross current signal during the last m number of cycles. However, the prediction unit 2391 can also output the current cross current signal (e.g., if the cross current only deviates on a scale larger than m cycles).

An adding unit 2394 receives the signals from the prediction unit 2391, the prediction unit 2392, and the momentary supply voltage from the momentary supply voltage register 2281 and transmits the sum of said signals to a comparing unit 2395. The comparing unit 2395 receives an estimated momentary supply voltage from an estimated momentary supply voltage register 2381 and a prediction throttle threshold from the prediction throttle threshold register 2371. The calculation for the estimated momentary supply voltage is discussed below in Table 1.

The output of logic gate 2341 transmits an alarm signal to the alarm register 2384 depending on the output of the comparing unit 2297 and the output of the comparing unit 2395. For example, the output of the logic gate 2341 can transmit an alarm signal to the alarm register 2384 when the momentary supply voltage is greater than the throttle threshold or when the estimated momentary supply voltage is greater than the prediction throttle threshold. The alarm register 2384 can be read by the subcircuit to initiate throttling of the subcircuit.

The power management unit 2200 further comprises a selected metric register 2367 for storing a selected value from the momentary supply voltage and the predictive metric. A selector 2342 can be used for the selection. The subcircuit associated with the power management unit 2200 can read the selected metric register 2367.

The registers 2283, 2282, 2281, 2384, 2273 can be updated every clock cycle. The registers 2271, 2272, 2274, and 2275 may not be updated during operation of the semiconductor circuit, but registers 2271, 2272, 2274, and 2275 can be written to only once after production of the semiconductor circuit.

It is noted that FIG. 2 is intended to depict the representative major components of an exemplary power management unit 2200. In some embodiments, however, individual components can have greater or lesser complexity than as represented in FIG. 2, components other than or in addition to those shown in FIG. 2 can be present, and the number, type, and configuration of such components can vary.

Figure 3:
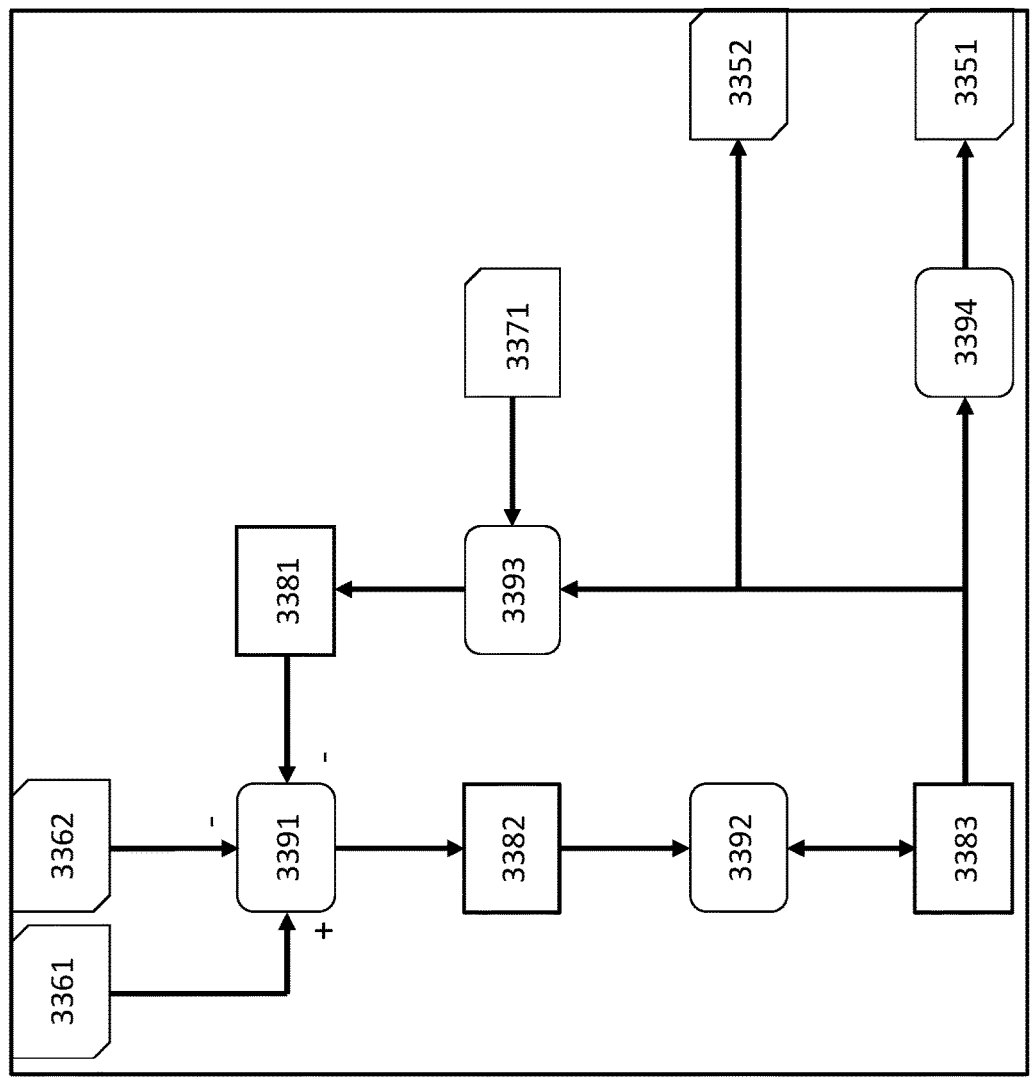
FIG. 3 is a diagram depicting a connecting unit, in accordance with embodiments of the present disclosure.

FIG. 3 illustrates a diagram of a connecting unit 3300 (e.g., connecting units 1301-1322 of FIG. 1). The connecting unit 3300 includes a first increment current signal input 3361 configured to receive a first increment current signal from a first power management unit and a second increment current signal input 3362 configured to receive a second increment current signal from a second power management unit. Further, the connecting unit 3300 includes a first current signal output 3351 configured to transmit a first current signal indicative of a cross current from the first subcircuit 1101 to the second subcircuit 1102 to the first power management unit 1201 and a second current signal output 3352 configured to transmit a second current signal to the second power management unit 1202, where the second current signal corresponds to the inverted first current signal. The connecting unit 3300 is configured to determine the first current signal based on the first increment signal and the second increment signal.

The connecting unit includes a connecting unit coefficient register 3371, an increment current sum register 3382, a cross current register 3383, a correction increment current register 3381, a summing unit 3391, an adding unit 3392, a multiplying unit 3393 and an inverting unit 3394. The summing unit 3391 receives the first increment current signal from the first increment current signal input 3361, the second increment current signal from the second increment current signal input 3362, and a correction increment current signal from the correction increment current register 3381. The summing unit 3391 transmits the first increment current signal minus the second increment current signal minus the correction increment current signal to the increment current sum register 3382. The adding unit 3392 receives an increment current sum signal from the increment current sum register 3382 and a cross current signal from the cross current register 3383 and transmits the sum of the increment current sum signal and the cross current signal to the cross current register 3383. The multiplying unit 3393 receives the cross current signal from the cross current register 3383 and a connection unit coefficient from the connection unit coefficient register 3371 and transmits the product of the cross current signal and the connection unit coefficient to the correction increment current register 3381. The inverting unit 3394 receives the cross current signal from the cross current register 3383 and transmits the negative cross current signal to the first current signal output 3351. The second current signal output 3352 receives the cross current signal from the cross current register 3383.

Table 1 depicts exemplary register values of a power management unit (e.g., power management unit 2200 of FIG. 2) in arbitrary units over 24 clock cycles.

TABLE 1

| Cycle | I_self (2282) | I_cross (2251-2256) | Q_total (2281) | th (2271) | 8*I_self_max (2392) | 8*I_cross (2391) | Q_pred (2381) | th_pred (2371) |
|---|---|---|---|---|---|---|---|---|
| 0 | 8 | 2 | 10 | 140 | | | | 140 |
| 1 | 9 | 2 | 21 | 140 | | | | 140 |
| 2 | 4 | 2 | 27 | 140 | | | | 140 |
| 3 | 10 | 2 | 39 | 140 | | | | 140 |
| 4 | 5 | 2 | 46 | 140 | | | | 140 |
| 5 | 2 | 2 | 50 | 140 | | | | 140 |
| 6 | 4 | 2 | 56 | 140 | | | | 140 |
| 7 | 6 | 2 | 64 | 140 | 80 | 16 | 160 | 140 |
| 8 | 12 | 0 | 76 | 140 | | | | 140 |
| 9 | 15 | 0 | 91 | 140 | | | | 140 |
| 10 | 9 | 0 | 100 | 140 | | | | 140 |
| 11 | 8 | 0 | 108 | 140 | | | | 140 |
| 12 | 11 | 0 | 119 | 140 | | | | 140 |
| 13 | 7 | 0 | 126 | 140 | | | | 140 |
| 14 | 14 | 0 | 140 | 140 | | | | 140 |
| 15 | 14 | 0 | 154 | 140 | 120 | 0 | 274 | 140 |
| 16 | 10 | −1 | 163 | 140 | | | | 140 |
| 17 | 5 | −1 | 167 | 140 | | | | 140 |
| 18 | 12 | −1 | 178 | 140 | | | | 140 |
| 19 | 11 | −1 | 188 | 140 | | | | 140 |
| 20 | 9 | −1 | 196 | 140 | | | | 140 |
| 21 | 3 | −1 | 198 | 140 | | | | 140 |

TABLE 1-continued

| Cycle | I_self (2282) | I_cross (2251-2256) | Q_total (2281) | th (2271) | 8*I_self_max (2392) | 8*I_cross (2391) | Q_pred (2381) | th_pred (2371) |
|---|---|---|---|---|---|---|---|---|
| 22 | 2 | −1 | 199 | 140 |  |  |  | 140 |
| 23 | 4 | −1 | 202 | 140 | 96 | −8 | 290 | 140 |

As shown in Table 1, the first column includes the clock cycle count, the second column includes power supply current values (e.g., stored by self-current register 2282), the third column includes cross current values (e.g., stored by current signal inputs 2251-2256), the fourth column includes the momentary supply voltage (e.g., stored by the momentary supply voltage register 2281), the fifth column includes voltage throttle values (e.g., stored by the throttle threshold register 2271), the sixth column includes self-current prediction values (e.g., stored by the prediction unit 2392), the seventh column includes cross current predictions values (e.g., stored by the prediction unit 2391), the eighth column includes estimated momentary supply voltage values (e.g., stored by the estimated momentary supply voltage register 2381), and the ninth column includes predicted voltage throttle values (e.g., stored by the prediction throttle threshold register 2371).

The predicted metrics (e.g., the predicted self-current values, predicted cross current values, and predicted momentary supply voltage values) can be determined every eight cycles. At cycle 7, the max self-current (e.g., I_self) within the last eight cycles window had a value of 10 (underlined). This value is multiplied with eight to estimate the maximal augmentation of the metric during the eight cycle window. Furthermore, the present cross current (e.g., I_cross) with a value of 2 (e.g., the sum of the present cross currents to the neighboring subcircuit) is multiplied with eight. At cycle time 7, the momentary supply voltage (e.g., Q_total) has the value 64 (underlined). Hence, the predictive metric (e.g., Q_pred) is calculated to have the value 10*8+2*8+64=160. This value surpasses the predictive threshold (e.g., th_pred) which has been set to 140. The predictive threshold th_pred has been set to the same value as the threshold for the momentary supply voltage. Thus, throttling of the subcircuit can be initiated.

The momentary supply voltage only exceeds the threshold for the momentary supply voltage at cycle time 15. Hence, using the predictive metric can allow for a precautionary early throttling to avoid voltage droops.

It is noted that FIG. 3 is intended to depict the representative major components of an exemplary connecting unit 3300. In some embodiments, however, individual components can have greater or lesser complexity than as represented in FIG. 3, components other than or in addition to those shown in FIG. 3 can be present, and the number, type, and configuration of such components can vary.

Figure 4:
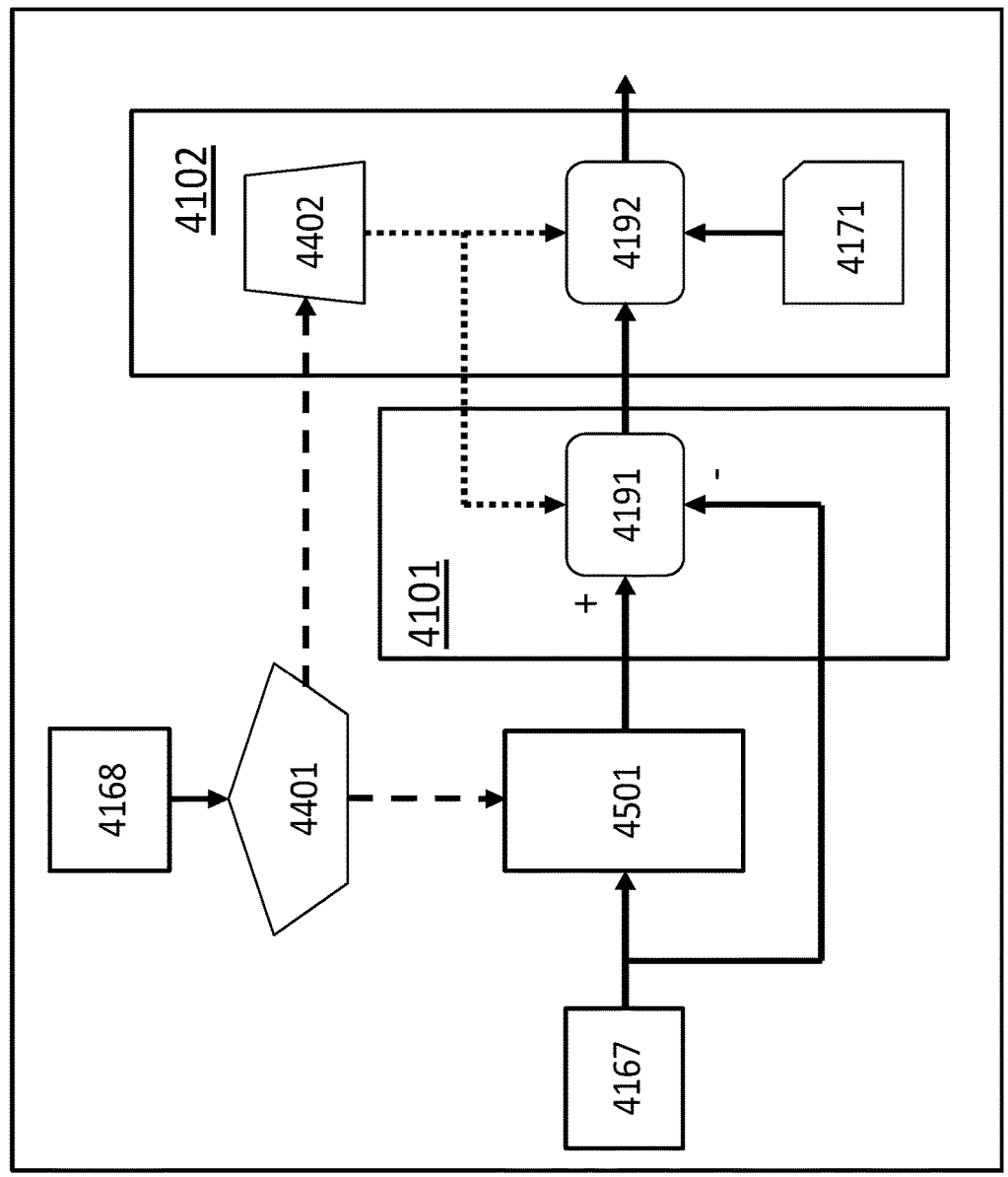
FIG. 4 is a diagram depicting an exemplary subcircuit of a semiconductor circuit, in accordance with embodiments of the present disclosure.

FIG. 4 is a diagram illustrating a first subcircuit 4100 (e.g., subcircuit 1101 of FIG. 1) of a semiconductor circuit. The subcircuit 4100 comprises a measurement input 4168 for receiving a discrete measured voltage value describing the measured supply voltage at the first subcircuit 4100 (e.g., from a CPM). The measured voltage value can provide comparably accurate information on the absolute value of the measured supply voltage. The measured voltage value has a first resolution. The first resolution can be a coarse resolution. For example, the measured voltage value can have a first resolution on the order of ten millivolts. More particularly, the first resolution can be approximately 20 mV.

The first subcircuit 4100 also comprises a simulator input 4167 for receiving a selected metric indicative of a supply voltage present at the first subcircuit 4100 (e.g., from a distributed dIPC). The selected metric can have a predefined second resolution. The selected metric received via the simulator input 4167 can provide less accurate information on the absolute value of the supply voltage presented at the first subcircuit 4100. The second resolution can be a fine resolution. For example, the selected metric can have a second resolution on the order of millivolts. In particular, the second resolution can be approximately 1 millivolt. The selected metric can be a momentary metric (e.g., Q_total of Table 1) or a predictive metric (e.g., Q_pred of Table 1) as explained with respect to FIG. 2. In particular, the selector 2342 can determine if the selected metric received by the simulator input 4167 is a momentary metric or a predictive metric.

The first subcircuit 4100 further comprises a calibrating circuit 4101 configured to calibrate the selected metric to obtain a calibrated metric when a transition of the measured voltage value occurs.

The calibration of the selected metric with the measured voltage value can allow for an improved detection of a risk of an under voltage condition.

Subcircuit 4100 can comprise a sampling register 4501. When the transition of the measured voltage value occurs, the selected metric is registered in the sampling register 4501. A comparator 4401 can determine the transition of the measured voltage value and trigger the registration of the selected metric received from the simulation input 4167 in the sampling register 4501 as indicated with a dashed line.

The transition of the measured voltage can correspond to a change of the measured voltage from a predefined value N to a value N−1.

The comparator 4401 can further trigger a timer 4402 of a throttle signal generator 4102 (as indicated with another dashed line in FIG. 4). Starting with the transition of the measured voltage, the timer 4402 counts backwards for a throttle monitoring period until a timeout.

As long as the timer 4402 is running, the calibration circuit 4101 is active (as indicated with a dotted line in FIG. 4). The calibration circuit 4101 comprises a calibration unit 4191. The calibration unit 4191 receives the selected metric registered in the sampling register 4501, which can also be called sampled metric. Moreover, the calibration unit 4191 receives the current selected metric from the simulator input 4167. The calibration unit 4191 transmits the difference of the sampled metric and the current selected metric to a comparator 4192 of the throttle signal generator 4102.

While the timer 4402 is running, the comparator 4192 compares the difference with a predetermined subcircuit throttle threshold stored in a subcircuit throttle threshold register 4171 and transmits a throttle signal if the difference is larger than the predetermined subcircuit throttle threshold.

Table 2 depicts exemplary register values of subcircuit 4100 according to FIG. 4 in arbitrary units over 11 cycles.

TABLE 2

| Cycle | Voltage [4168] | Counter [4402] | Q_select [4167] | Q_select_sample [4501] | Q_diff [4191] | Threshold [4171] |
|---|---|---|---|---|---|---|
| 0 | 4 | 0 | 12 | | | 15 |
| 1 | 4 | 0 | 15 | | | 15 |
| 2 | 4 | 0 | 14 | | | 15 |
| 3 | 4 | 0 | 9 | | | 15 |
| 4 | 4 | 0 | 12 | | | 15 |
| 5 | 4 | 16 | 18 | 18 | 0 | 15 |
| 6 | 5 | 15 | 22 | 18 | 4 | 15 |
| 7 | 5 | 14 | 25 | 18 | 7 | 15 |
| 8 | 5 | 13 | 32 | 18 | 14 | 15 |
| 9 | 5 | 12 | 31 | 18 | 13 | 15 |
| 10 | 5 | 11 | 34 | 18 | 16 | 15 |

As depicted in Table 2, the first column includes the clock cycle number, the second column includes discrete measured voltage values describing the measured supply voltage (e.g., received by measurement input 4168), the third column includes timer count (e.g., calculated by the timer 4402), the fourth column includes the selected metric indicative of the supply voltage present at the first subcircuit 4100 (e.g., received by a simulator input 4167), the fifth column includes the selected metric registered in the sampling register 4501 when the transition of the measured voltage value occurs, the sixth column includes the difference of the sampled metric and the current selected metric (e.g., determined by the calibration unit 4191), and the seventh column includes the predetermined subcircuit throttle threshold (e.g., stored in the subcircuit throttle threshold register 4171).

At cycle number 6, the measured voltage value (e.g., from a CPM) describing the measured supply voltage at the first subcircuit switches from 4 to 5. Accordingly, the comparator 4401 activates the counter and sets it to the initial value 16. In addition, the selected metric Q_select=18 is sampled in the sampling register 4501 as sampled metric Q_select_sample. Hence, at cycle time 5, the difference between Q_select and Q_select_sample (which can be considered as a calibrated metric) is zero. At cycle time 10, the selected metric Q_select has the value 34. Thus, the calibrated metric amounts to 16 and exceeds the throttle threshold and the throttle signal generator 4102 initiates throttling of the first subcircuit 4100.

The aforementioned subcircuit 4100 combines accurate absolute voltage measurements at course resolutions (e.g., via chip power model) with inaccurate absolute voltage measurements at fine resolutions (e.g., via distributed deferred instructions per cycle) to achieve fast and accurate on-chip voltage measurements. The combination of detecting a low voltage conditions via CPM and tracking the voltage with distributed dIPC increases the resolution of the voltage measurement and allows for faster throttling.

It is noted that FIG. 4 is intended to depict the representative major components of an exemplary subcircuit 4100. In some embodiments, however, individual components can have greater or lesser complexity than as represented in FIG. 4, components other than or in addition to those shown in FIG. 4 can be present, and the number, type, and configuration of such components can vary.

Figure 5:
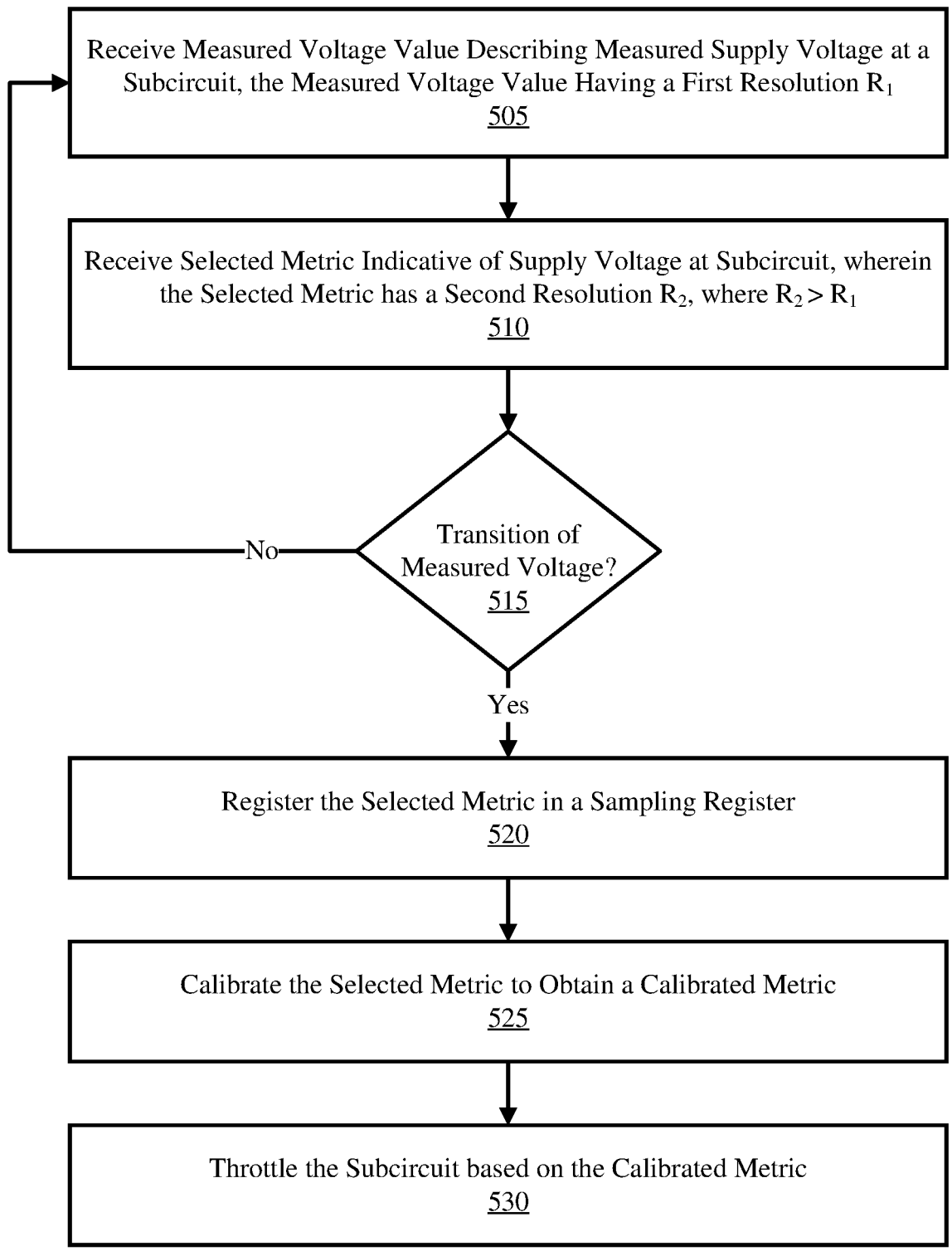
FIG. 5 is a flow-diagram illustrating an example method for throttling a subcircuit based on a calibrated metric, in accordance with embodiments of the present disclosure.

Referring now to FIG. 5, shown is a flow-diagram illustrating a method 500 for throttling a subcircuit (e.g., subcircuit 1101 or 4100) based on a calibrated metric (e.g., Q_diff of Table 2), in accordance with embodiments of the present disclosure.

Method 500 initiates at operation 505, where a measured voltage value describing measured supply voltage at a subcircuit is received (e.g., by measurement input 4168). The voltage value may be specified in any suitable electric potential unit. In some embodiments, the measured voltage value is received from a Chip Power Model circuit. The measured voltage value has a first resolution. In embodiments, the first resolution can be a coarse resolution. For example, the measured voltage value can have a first resolution on the order of ten millivolts. More particularly, the first resolution can be approximately 20 mV.

A selected metric indicative of supply voltage at the subcircuit is then received (e.g., by simulator input 4167). This is illustrated at operation 510. The voltage value of the selected metric can be specified in any suitable electric potential unit. In some embodiments, the selected metric indicative of supply voltage at the subcircuit is received from a distributed deferred instruction per cycle (dIPC) measurement. The selected metric can have a predefined second resolution. The selected metric can provide less accurate information on the absolute value of the supply voltage at the subcircuit. However, the second resolution can be a fine resolution. For example, the selected metric can have a second resolution on the order of millivolts. In particular, the second resolution can be approximately 1 millivolt. The selected metric can be a momentary metric (e.g., Q_total of Table 1) or a predictive metric (e.g., Q_pred of Table 1) as explained with respect to FIG. 2.

A determination is then made whether a transition of the measured voltage value occurs. This is illustrated at operation 515. For example, at cycle 6 of Table 2, the measured voltage value transitions from 4 to 5.

If a determination is made that the measured voltage value does not transition, then method 500 returns to operation 505, where additional measured voltage values are received. If a determination is made that the measured voltage value does transition, then method 500 transitions to operation 520, where the selected metric is registered in a sampling register (e.g., sampling register 4501).

The selected metric is then calibrated to obtain a calibrated metric (e.g., Q_diff of Table 2). This is illustrated at operation 525. The calibrated metric can be the difference between the selected metric stored in the sampling register and the calibrated metric at the current clock cycle. For example, referring to Table 2, at cycle time 5, the difference between Q_select and Q_select_sample is zero, thus the calibrated metric is 0. At cycle time 10, the selected metric Q_select has the value 34, thus the calibrated metric is 16 (e.g., 34-18).

The subcircuit is then throttled based on the calibrated metric. This is illustrated at operation 530. For example, referring to Table 2, when the calibrated metric exceeds the throttle threshold, the subcircuit is throttled. This occurs at clock cycle 10, when the calibrated metric of 16 exceeds the throttle threshold of 15.

The aforementioned operations can be completed in any order and are not limited to those described. Additionally, some, all, or none of the aforementioned operations can be completed, while still remaining within the spirit and scope of the present disclosure.

The invention claimed is:

1. A semiconductor circuit comprising:
a first subcircuit including a measurement input configured to receive a measured voltage value describing a measured supply voltage at the first subcircuit, wherein the measured voltage value has a first resolution;
a simulator input configured to receive a selected metric indicative of a supply voltage present at the first subcircuit, wherein the selected metric has a second resolution, wherein the second resolution is higher than the first resolution;
a calibration circuit configured to calibrate the selected metric to obtain a calibrated metric when a transition of the measured voltage value occurs, wherein the calibrated metric is a difference between the selected metric at a future clock cycle and the selected metric when the transition of the measured voltage value occurs; and
a throttle signal generator configured to generate a subcircuit throttle signal to throttle the first subcircuit based on the calibrated metric exceeding a throttle threshold.

2. The semiconductor circuit of claim 1, wherein the calibration circuit comprises a sampling register, wherein the calibration circuit is configured to register the selected metric in the sampling register when the transition of the measured voltage value occurs.

3. The semiconductor circuit of claim 1, wherein the transition of the measured voltage value corresponds to a change of the measured voltage value from a predefined value (N) to a value (N−1) less than the predefined value (N).

4. The semiconductor circuit of claim 1, wherein the throttle signal generator comprises a timer configured to activate the throttle signal generator for a throttle monitoring period triggered by the transition of the measured voltage value.

5. The semiconductor circuit of claim 4, wherein the timer is further configured to activate the calibration circuit for the throttle monitoring period triggered by the transition of the measured voltage value.

6. The semiconductor circuit of claim 1, wherein the semiconductor circuit comprises a power management circuitry, wherein the power management circuitry is configured to determine an estimated momentary supply voltage present at the first subcircuit based on a power supply current of the first subcircuit.

7. The semiconductor circuit of claim 6, further comprising at least one second subcircuit, wherein the power management circuitry is configured to determine the estimated momentary supply voltage present at the first subcircuit based on the power supply current of the first subcircuit and a momentary cross current flowing between the first subcircuit and the at least one second subcircuit.

8. The semiconductor circuit of claim 1, wherein a power management circuitry is configured to determine an estimated momentary supply voltage present at the first subcircuit based on a power supply current of the first subcircuit over a first previous number of clock cycles.

9. The semiconductor circuit of claim 8, wherein the power management circuitry is configured to determine the estimated momentary supply voltage based on the power supply current of the first subcircuit over the first previous number of clock cycles and a cross current flowing between the first subcircuit and a second subcircuit over the first previous number of clock cycles.

10. The semiconductor circuit according to claim 8, wherein the power management circuitry further comprises a selector configured to select the estimated momentary supply voltage as the selected metric.

11. A method for preventing under voltage conditions, the method comprising:
receiving a measured voltage value describing a measured supply voltage at a first subcircuit of a semiconductor circuit, wherein the measured voltage value has a first resolution;
receiving a selected metric indicative of a supply voltage present at the first subcircuit, wherein the selected metric has a second resolution, wherein the second resolution is higher than the first resolution;
calibrating the selected metric to obtain a calibrated metric when a transition of the measured voltage value occurs, wherein the calibrated metric is a difference between the selected metric at a future clock cycle and the selected metric when the transition of the measured voltage value occurs; and
generating a subcircuit throttle signal to throttle the first subcircuit based on the calibrated metric exceeding a throttle threshold.

12. The method of claim 11, further comprising:
registering the selected metric in a sampling register when the transition of the measured voltage value occurs.

13. The method of claim 11, wherein throttling the subcircuit based on the calibrated metric is only performed for a throttle monitoring period after the transition of the measured voltage value.

14. The method of claim 11, wherein the transition of the measured voltage value corresponds to a change of the measured voltage value from a predefined value to a value less than the predefined value.

15. The method of claim 11, wherein the selected metric corresponds to a momentary supply voltage currently present at the first subcircuit.

16. The method of claim 11, wherein the selected metric corresponds to an estimated momentary supply voltage indicative of a future voltage present at the first subcircuit.

17. The method of claim 16, wherein the estimated momentary supply voltage is estimated based on a power supply current of the first subcircuit.

18. The method of claim 16, wherein the estimated momentary supply voltage is estimated based on a power supply current of the first subcircuit and a cross current flowing between the first subcircuit and a second subcircuit.

* * * * *